United States Patent
Moslehi

[19]
[11] Patent Number: 6,138,745
[45] Date of Patent: *Oct. 31, 2000

[54] TWO-STAGE SEALING SYSTEM FOR THERMALLY CONDUCTIVE CHUCK

[75] Inventor: Mehrdad M. Moslehi, Los Altos, Calif.

[73] Assignee: CVC Products, Inc., Rochester, N.Y.

[*] Notice: This patent is subject to a terminal disclaimer.

[21] Appl. No.: 08/938,293

[22] Filed: Sep. 26, 1997

[51] Int. Cl.[7] ...................................................... F28F 7/00
[52] U.S. Cl. ........................ 165/80.1; 165/80.2; 156/345; 118/728
[58] Field of Search .................................. 165/80.1, 80.2, 165/185; 118/724, 725, 728; 156/345

[56] References Cited

U.S. PATENT DOCUMENTS

| | | |
|---|---|---|
| 4,194,233 | 3/1980 | Jones et al. . |
| 4,603,466 | 8/1986 | Morley . |
| 4,615,755 | 10/1986 | Tracey et al. . |
| 4,680,061 | 7/1987 | Lamont, Jr. . |
| 4,743,570 | 5/1988 | Lamont, Jr. . |
| 4,909,314 | 3/1990 | Lamont, Jr. . |
| 4,949,783 | 8/1990 | Lakios et al. . |
| 4,971,653 | 11/1990 | Powell et al. . |
| 5,096,536 | 3/1992 | Cathey, Jr. .......................... 118/724 X |
| 5,103,367 | 4/1992 | Horwitz et al. . |
| 5,177,878 | 1/1993 | Visser . |
| 5,180,000 | 1/1993 | Wagner et al. . |
| 5,192,849 | 3/1993 | Moslehi . |
| 5,267,607 | 12/1993 | Wada . |
| 5,300,175 | 4/1994 | Gardner et al. . |
| 5,320,982 | 6/1994 | Tsubone et al. . |
| 5,325,261 | 6/1994 | Horowitz . |
| 5,326,725 | 7/1994 | Sherstinsky et al. . |
| 5,343,012 | 8/1994 | Hardy et al. ............................ 118/725 |
| 5,382,311 | 1/1995 | Ishikawa et al. . |
| 5,383,971 | 1/1995 | Selbrede . |
| 5,421,401 | 6/1995 | Sherstinsky et al. ................... 165/80.2 |
| 5,567,267 | 10/1996 | Kazama et al. . |
| 5,660,699 | 8/1997 | Saito et al. ............................ 269/21 X |
| 5,730,804 | 3/1998 | Gomi et al. . |
| 5,738,751 | 4/1998 | Camerson ............................. 156/345 |
| 5,775,416 | 7/1998 | Heimanson et al. . |
| 5,804,089 | 9/1998 | Suzuki et al. . |
| 5,805,408 | 9/1998 | Maraschin et al. . |
| 5,861,061 | 1/1999 | Hayes et al. . |
| 5,936,829 | 8/1999 | Moslehi . |

*Primary Examiner*—Leonard Leo
*Attorney, Agent, or Firm*—Eugene Stephens & Associates

[57] ABSTRACT

A chuck having two distinct portions mounts a substrate within a vacuum processing chamber. A first sealing stage confines a gas within a heat-transfer interface between one portion of the chuck and the substrate. A second sealing stage collects gas escaping from the heat-transfer interface within an intermediate space bounded by the two portions of the chuck and the substrate. Pressure in the intermediate space is reduced with respect to pressure at the heat-transfer interface to inhibit leakage of gas from the heat-transfer interface into the vacuum processing chamber.

7 Claims, 12 Drawing Sheets

TWO-STAGE SEALING SYSTEM FOR THERMALLY CONDUCTIVE CHUCK

TECHNICAL FIELD

The invention relates to supporting substrates in a near vacuum or other low-pressure processing environments using thermally conductive as well as temperature-regulating chucks for transferring heat to or from the substrates.

BACKGROUND

Vacuum processing operations take place in vacuum chambers that provide near vacuum or other low-pressure environments for processing substrates. Chucks support the substrates within the processing chambers. Some such chucks merely provide a substrate support platform and rely on gravity to hold the substrates in place. Others actively secure the substrates with either mechanical or electrostatic clamps.

Some chucks are also involved with the processing of the substrates by producing electrical or magnetic fields or by regulating heat transfers to or from the substrates. Such electrical fields (e.g., bias) can be used to generate or enhance a plasma as well as to direct plasma ions impinging on the substrate. Such magnetic fields can be used to also influence the plasma or to magnetically orient films during plasma-assisted deposition or thermal anneals. Heat transfers are used to remove excess heat from the substrates produced by such processing operations or to provide a controlled amount of substrate heating for assisting such processing operations. Some operations are best performed at fixed substrate temperatures or at substrate temperatures that are adjusted throughout different stages of the operations. Plasma sputtering operations such as chemical-vapor deposition (CVD) and metal-organic chemical-vapor deposition (MOCVD) require active substrate heating, while other sputtering operations require active substrate cooling. During operations like thermal annealing, elevated temperatures actually accomplish the substrate processing.

However, controlling substrate temperatures in near vacuum or other low-pressure environments is quite difficult because heat does not transfer well between objects in such environments. For example, the conduction of heat between contiguous surfaces of a chuck body and the substrate in a low-pressure environment is slow and inefficient because actual contact on an atomic scale between the surfaces is limited to a small fraction of their common areas, and gaps that separate the remaining common areas of their surfaces prevent effective heat transfer by conduction.

Heating and cooling of substrates through radiational heat transfers are possible in low-pressure environments, particularly at elevated substrate and chuck temperatures, but radiational heat transfers are generally too slow to maintain substrates at desired processing temperatures. Below 500° C., which includes most chuck-based fabrication processes, radiational heat transfers are too inefficient to regulate substrate processing temperatures.

Faster transfers are possible by pumping a gas, preferably an inert gas such as helium or argon or another gas such as nitrogen or hydrogen, between the chuck body and the substrate. Although still at much less than atmospheric pressure (e.g., 1 Torr to 20 Torr), the gas (referred to as "backside gas") sufficiently fills the small gaps between the chuck body and the substrate to support significant heat transfer through thermal conduction between them. A seal formed between the mounting surface of the chuck body and the substrate resists significant leakage of the gas into the rest of processing the chamber, which could disturb substrate processing operations.

U.S. Pat. No. 4,680,061 to Lamont, Jr. discloses chucks having heating or cooling elements for regulating substrate temperatures. One of the chucks has a ceramic heating element mounted in a cavity between a chuck body and a substrate. The heating element is mounted close to a back side of the substrate but not in contact. Argon gas is introduced into the cavity to promote heat exchanges between the heating element and the substrate. A raised rim of the chuck body on which the substrate is mounted contacts a peripheral portion of the substrate's back side forming a seal that inhibits leakage of the gas out of the cavity.

Another of Lamont, Jr.'s chucks has a chuck body that functions as a heat sink with coolant channels for removing heat from the sink. A similar cavity is formed by a raised rim in the chuck body so that the remaining heat sink is positioned close but not in contact with the back side of a substrate. Argon gas is similarly trapped within the cavity by contact between the raised rim of the chuck and the back side of the substrate. Thus, the raised rim that supports the substrate also functions as a seal for inhibiting leakage of the gas into the rest of the processing chamber.

U.S. Pat. No. 4,949,783 to Lakios et al. also discloses a chuck using gas pressure against a back side of a substrate to promote substrate cooling. A similar cavity is formed in the chuck body and surrounded by a raised rim for contacting the back side of the substrate. However, instead of merely pumping backside gas into the cavity, Lakios et al. circulate the backside gas both into and out of the cavity by establishing a gas flow. Part of the heat transfer from the substrate is due to gas-conducted heat exchanges with the chuck body, and another part of the heat transfer is due to the removal of heated gas from the cavity.

The chucks of both Lamont, Jr. and Lakios et al. include raised rims on their chuck bodies that function as both mounting surfaces and seals. Mechanical clamps press the substrates against the raised rims of their chuck bodies to tighten the seals and to reduce leakage of backside gas into their processing chambers. Lakios et al. also use an O-ring seal next to their raised rim to provide an even tighter seal for further reducing leakage. However, such O-ring seals are normally not useable for elevated substrate-temperature processing (e.g., above 200° C.) because of thermal limitations of elastomer seals.

The raised rims of the prior chucks separate conductive portions of the chuck body from the substrate, which reduces efficiency of heat transfers between them. Also, some leakage of substrate backside gas can occur through the raised rims, particularly through rims made to withstand elevated temperatures during substrate heating operations. Substrate back side surface roughness can also reduce the effectiveness of the raised rim seals and lead to excessive leakage of backside gas into the processing region of the processing chamber.

SUMMARY OF INVENTION

This invention in one or more of its embodiments improves chucks that use gas or other fluid as a medium for transferring heat to or from substrates in a vacuum processor by providing a two-stage sealing system that reduces leakage of the gas from between the chucks and the substrates into the processing region of the vacuum processor. A first sealing stage confines the gas between preferably contiguous first portions of the chucks and substrates for supporting transfers of heat. A second sealing stage collects gas escaping through the first sealing stage into an intermediate space between second portions of the chucks and substrates at a reduced pressure with respect to the pressure at which the gas is confined within the heat-transfer interface.

The processing region of the vacuum processor is a first pressure-regulatable space. The first sealing stage together with the first portions of the chuck and substrate forms a second pressure-regulatable space, and the second sealing stage together with the second portions of the chuck and substrate forms a third pressure-regulatable space. Pressure in the third pressure-regulatable space is reduced with respect to pressure in the second pressure-regulatable space to further inhibit leakage of gas from the second pressure-regulatable space into the first pressure-regulatable space.

One particular embodiment includes a chuck body having a mounting surface that supports the substrate for processing within the first pressure-regulatable space of the processing chamber. The mounting surface forms together with the substrate a second pressure-regulatable space for assisting transfers of heat between the chuck body and the substrate. A clamp presses the substrate against the mounting surface and forms together with the chuck body and the substrate a third pressure-regulatable space that extends beyond a periphery of the substrate between the first and second pressure-regulatable spaces.

The substrate includes a front surface (usually comprising devices in various stages of fabrication) exposed to pressure in the first pressure-regulatable space and a back surface exposed to pressure in the second pressure-regulatable space. The mounting surface contacts the back surface of the substrate for inhibiting flows of fluid (e.g., backside gas) between the second and third pressure-regulatable spaces. The clamp contacts the front surface of the substrate and the chuck body (or an extension of the chuck body) for inhibiting flows of fluid between the first and third pressure-regulatable spaces.

The mounting surface and the back surface of the substrate are preferably contiguous over most of their common overlapping areas to enhance transfers of heat between them. Channels in the mounting surface interrupt a central portion of the common area to circulate gas within the second pressure-regulatable space, while a surrounding portion of the common area remains uninterrupted to provide the first-stage seal.

A recess in the clamp or the chuck body provides an enclosed cavity or manifold for collecting gas within the third pressure-regulatable space. One second-stage seal joins the clamp to the front surface of the substrate, and another second-stage seal joins the clamp to the chuck body. One of the second-stage seals is preferably mounted from a flexible portion of the clamp to assure contact at both second-stage seals of the clamp as well as the first-stage seal between the mounting surface of the chuck body and the substrate.

Inlet and outlet conduits preferably provide a continuous flow of gas through the second pressure-regulatable space. Separately controlled outlet conduits can be used to remove gas from the third pressure-regulatable space for reducing the pressure in the third pressure-regulatable space with respect to the pressure in the second pressure-regulatable space and for minimizing substrate backside gas leakage into the processing portion of the processing chamber (i.e., the first pressure-regulatable space).

Another embodiment can be described as having first and second substrate mounting components for mounting a substrate for processing in a first pressure-regulatable space and for forming together with the substrate second and third pressure-regulatable spaces. The first substrate mounting component, which is in thermal communication with a temperature-regulating (e.g., heating or cooling) element, has a first-stage seal surrounding a central portion of the substrate for confining fluid (e.g., backside gas) within the second pressure-regulatable space. A second substrate mounting component, which is at least partially thermally isolated from the temperature-regulating element and the first substrate mounting component, has at least one second-stage seal surrounding the second pressure-regulatable space for confining fluid within the third pressure-regulatable space in substantial isolation from the first pressure-regulatable space. A control system reduces pressure in the third pressure-regulatable space with respect to pressure in the second pressure-regulatable space to inhibit leakage of fluid from the second pressure-regulatable space into the first pressure-regulatable space.

The first substrate mounting component can include a chuck body having a mounting surface that supports the substrate for processing within the first pressure-regulatable space of the processing chamber. The second substrate mounting component can take various forms including a mechanical clamp as described above or a peripheral support surrounding the chuck body. In the latter case, the mounting surface can be built up from alternating layers of electrically conductive and non-conductive films patterned as electrodes to form an electrostatic clamp for pressing the substrate against the chuck body as well as the peripheral support. A first second-stage seal joins the peripheral support to the back surface of the substrate, and a second second-stage seal joins the peripheral support to the chuck body or an extension of the chuck body. The second second-stage seal can join the peripheral support directly to a heat-conducting portion of the chuck body or indirectly through a thermal insulator. Particularly during heating operations, the peripheral support is preferably constructed to minimize transmissions of heat with either the substrate or the chuck body.

Since the second substrate mounting component (e.g., peripheral support) is interposed between the heat-conducting portion of the chuck body and the first second-stage seal, more options are available for regulating temperatures at the first second-stage seal. For example, the second substrate mounting component can function as a thermal insulator during heating operations to lower temperatures at the first second-stage seal. The area of the second substrate mounting component exposed to gas within the third pressure-regulatable space and the proximity of the second substrate mounting component to the heat-conducting portion of the chuck body are other design variables that can be used to regulate thermal conduction of the second substrate mounting component.

DETAILED DESCRIPTION

Figure 1:
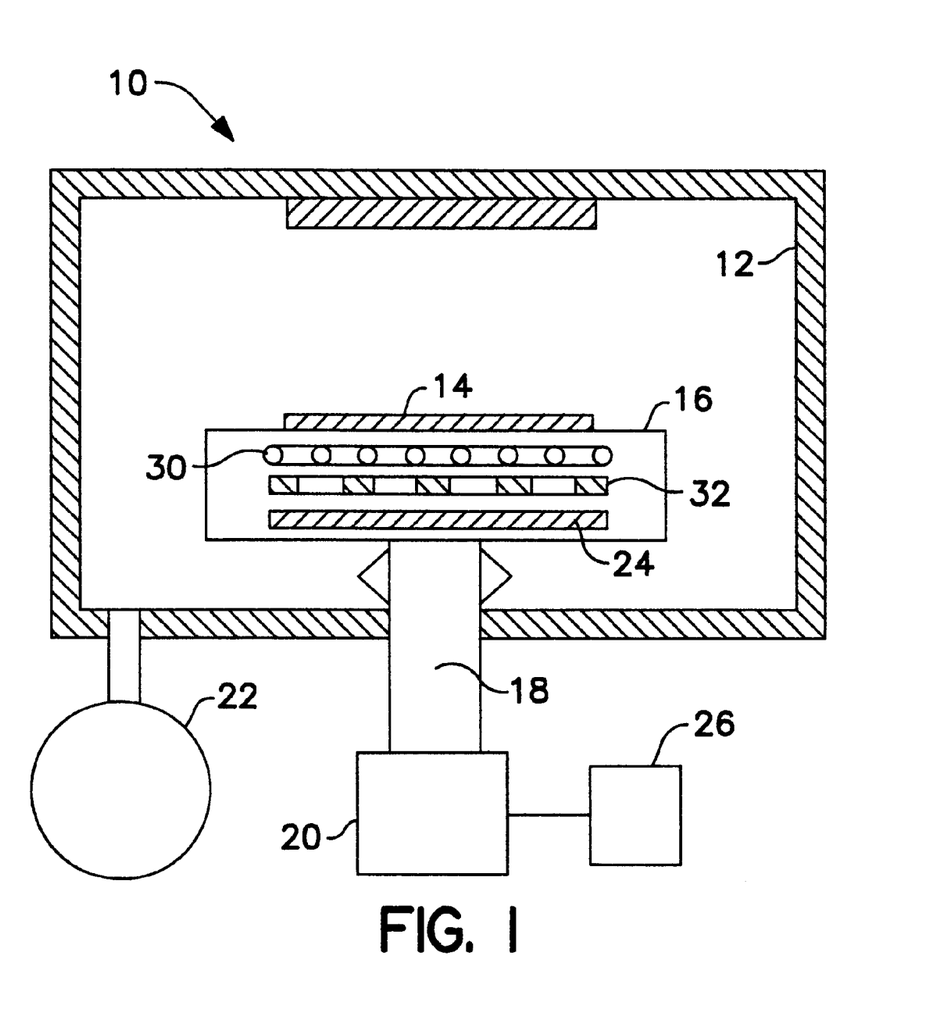
FIG. 1 is a schematic cross-sectional view of a low-pressure processing chamber in which a substrate is mounted on an adjustable-height chuck.

A vacuum processor 10, which is depicted schematically in FIG. 1, includes a vacuum processing chamber 12 for processing a substrate 14. A chuck 16 supports the substrate 14 within a low-pressure processing environment of the vacuum processing chamber 12 in positions that can be varied along a reference axis 18 (for instance, to provide an adjustable substrate-to-target spacing for physical-vapor deposition, PVD, operations). A drive mechanism 20 moves the chuck 16 together with the substrate 14 along the reference axis 18 for positioning the substrate 14 within the processing chamber 12 at an optimal position for substrate processing.

A pump 22 evacuates the processing chamber 12 for supporting operations that are best performed in a low-pressure environment. For example, the vacuum processor 10 is intended for operations such as physical-vapor deposition (PVD) (including ion-beam deposition and sputtering), chemical-vapor deposition (CVD), plasma-enhanced chemical-vapor deposition (PECVD), and metal-organic chemical-vapor deposition (MOCVD)—all of which deposit material layers on the substrate 14. Other exemplary treatment operations affecting the substrate or the deposited materials include planarization, annealing, plasma etching, and cleaning processes.

Various electrical and magnetic fields can be used for initiating, enhancing, or controlling these operations. In the vicinity of the substrate 14, a magnetic field can be used for orienting magnetic materials that are deposited on the substrate, and an electrical bias (e.g., DC or RF) can be used for directing or otherwise regulating the impact of ions on the substrate 14. Polarities of the various fields can also be varied to further influence or control operations. For example, the chuck 16 contains a plate-shaped electromagnet 24 for supporting operations requiring a magnetic field in the vicinity of the substrate 14 (e.g., a thin-film head substrate) and is also connected to an RF power generator 26 for supporting operations requiring a fluctuating electrical bias.

Also within the chuck 16 are two temperature regulators, namely, a heating element 30 and a cooling element 32. The heating element 30 supports operations requiring elevated substrate temperatures (e.g., up to 650° C. for PVD, CVD, and MOCVD operations), and the cooling element 32 supports operations requiring withdrawal of excess heat from the substrate 14. Together, the heating and cooling elements 30 and 32 can optimize substrate temperatures throughout various stages of processing that are best performed at particular temperatures or rates of substrate temperature change. Further details of a chuck containing both heating and cooling elements are disclosed in co-assigned U.S. application Ser. No. 08/560,344, filed Nov. 17, 1995. This application is hereby incorporated by reference.

This invention, which relates to transfers of heat between the substrate 14 and the chuck 16, can be practiced with different combinations of these components for supporting particular processing operations. For example, only the heating element 30 or only the cooling element 32 can be incorporated into the chuck 16 to support operations requiring either controlled substrate heating or cooling. A single temperature regulator for both heating and cooling could also be used. In addition, the chuck 16 itself could be used as a high-thermal-mass heat sink independent of any other temperature regulator.

Figure 2:
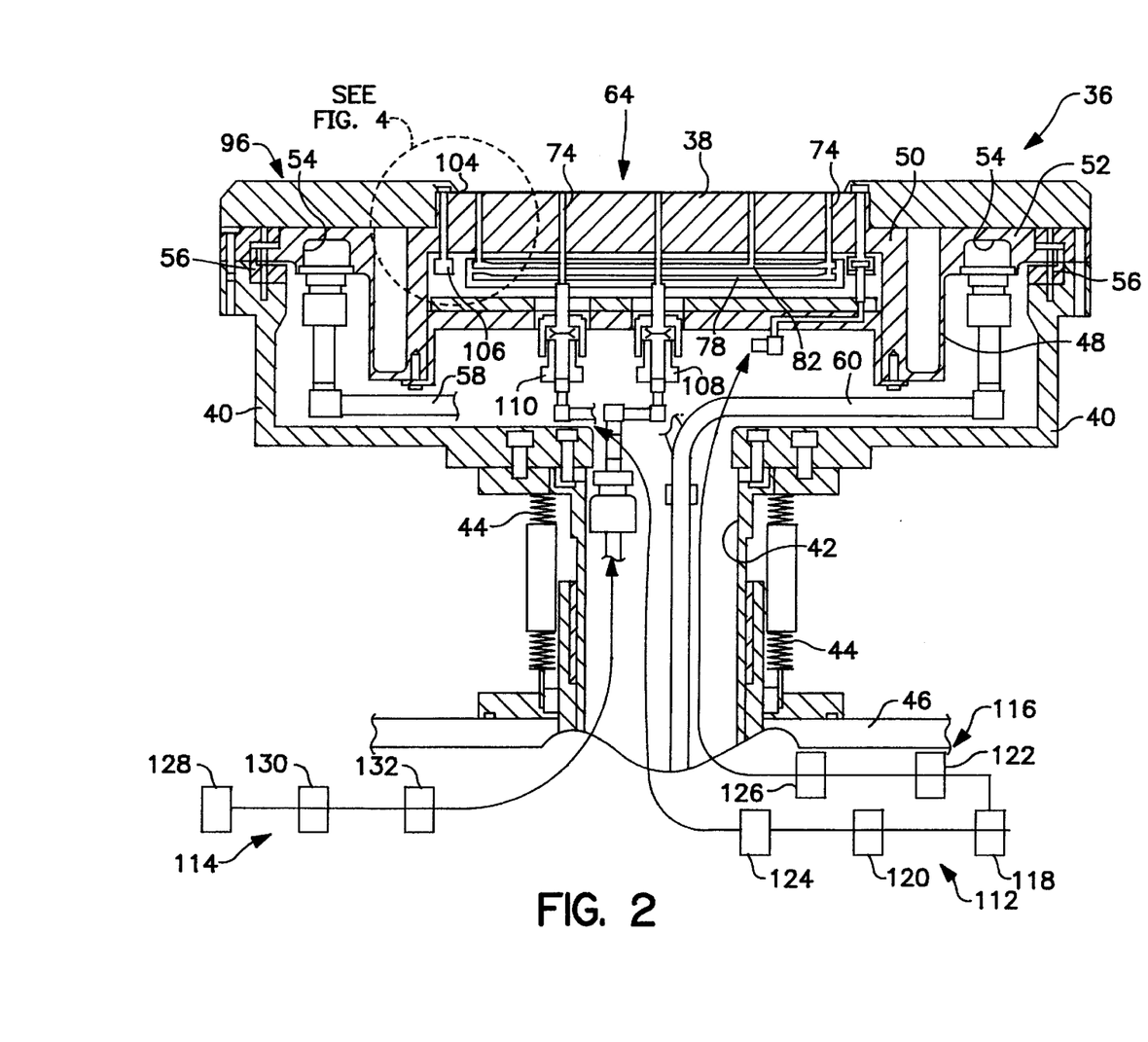
FIG. 2 is a more detailed cross-sectional view of an exemplary chuck having gas flow controls shown schematically.
Figure 3:
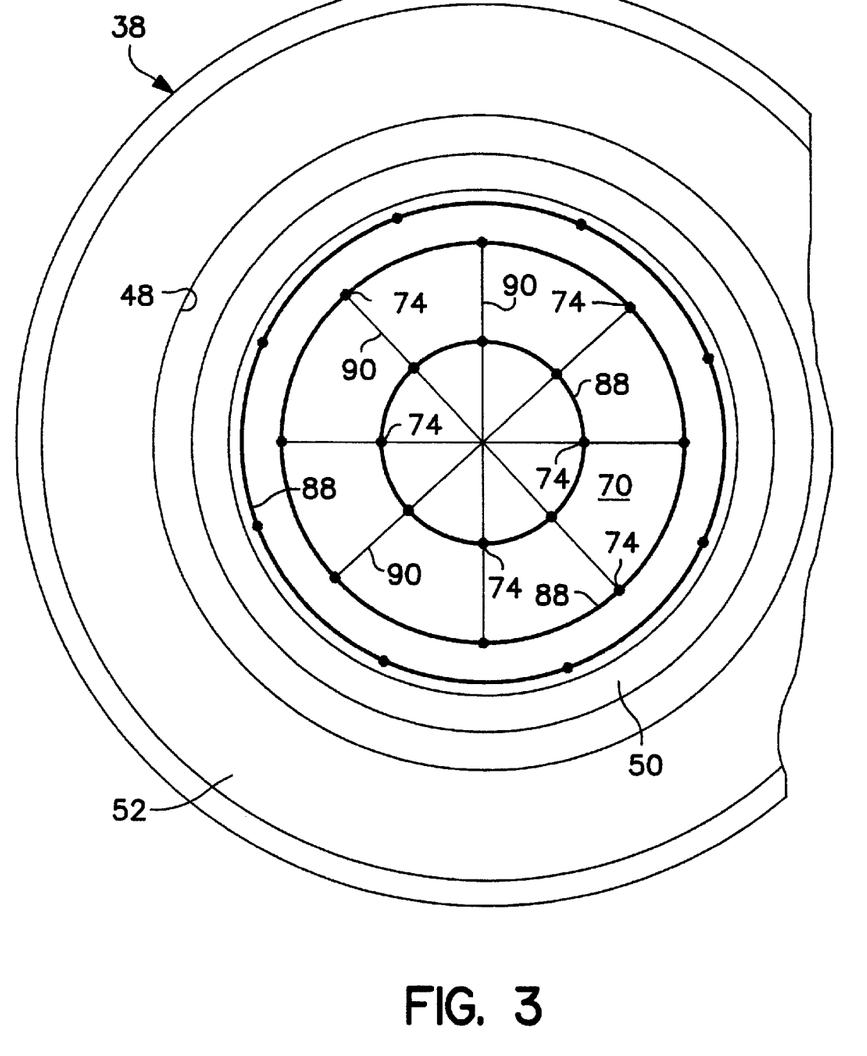
FIG. 3 is a top view of a body of the chuck shown in FIG. 2 with a mechanical clamp and the substrate removed to show underlying features including a pattern of channels for circulating gas between the chuck body and the substrate.
Figure 4:
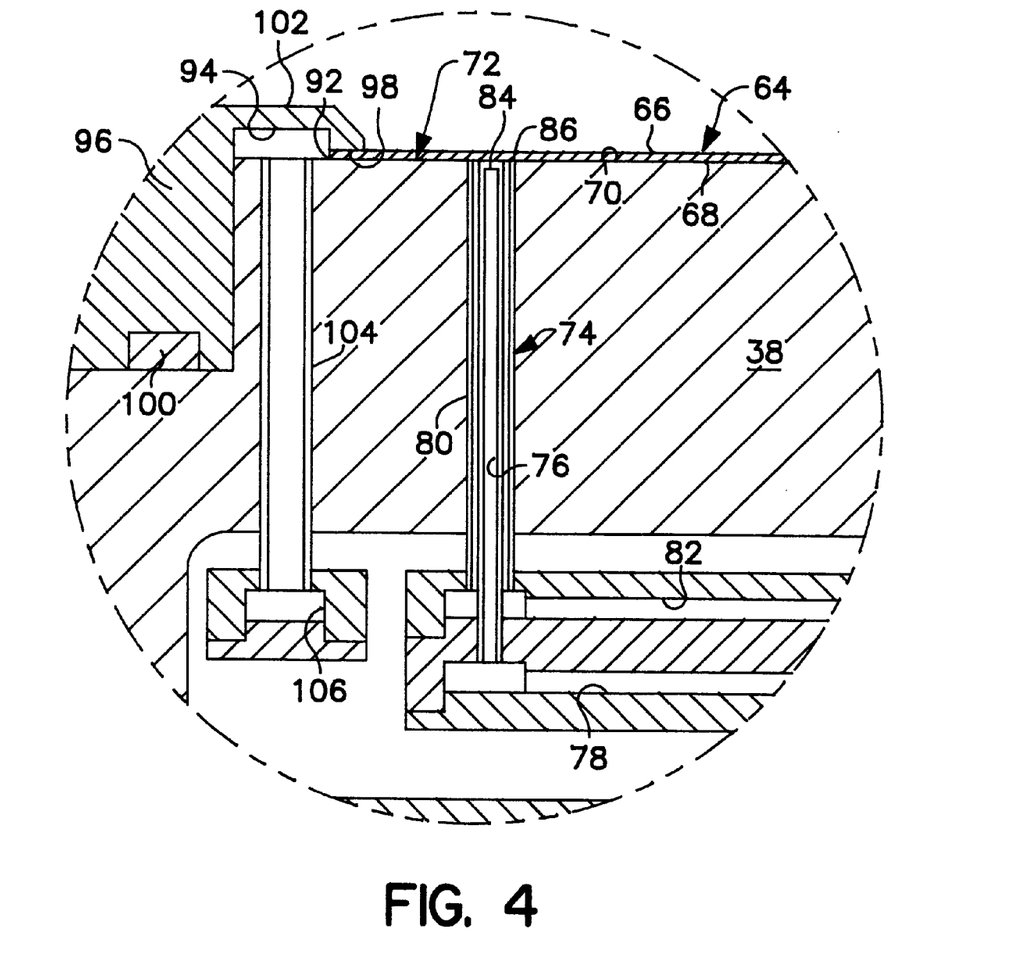
FIG. 4 is an enlarged partial view of FIG. 2 showing a region of engagement between the mechanical clamp, the substrate, and the chuck body for forming two sealing stages.

More detailed views of an exemplary chuck 36 for carrying out this invention are shown in FIGS. 2–4. The chuck 36 has a chuck body 38, a shroud (or chuck housing) 40, and a support column 42. Bellows 44 surround the support column 42 for sealing the shroud 410 to a base plate of processing chamber 46, which is only partially shown.

Within the chuck body 38 (made of metal or a metallic alloy), a thin-walled trough 48 thermally separates inner and outer portions 50 and 52 of the chuck body 38. The thin-walled trough 48 minimizes heat transfer or heat loss from the inner portion 50 of the chuck body 38 to the water-cooled and vacuum-sealed outer portion 52 of the chuck body 38. An annular coolant passage 54 lowers temperatures of an outer portion 52 of the chuck body 38 for protecting an elastomer seal 56 between the chuck body 38 and the shroud 40, particularly during substrate heating operations. Conduits 58 and 60 carry coolant (e.g., water) to and from the annular passage 54 within a conventional coolant circulation or flow system, the rest of which is not shown.

A substrate 64, such as a silicon wafer or a thin-film head substrate, having a front surface 66 and a back surface 68 is supported in contact or in proximity with a mounting surface 70 of the chuck body 38. The front surface 66 is exposed for processing within a first pressure-regulatable space of the processing chamber 46. The back surface 68 forms together with the mounting surface 70 an interface 72 through which heat can be transferred between the chuck body 38 and the substrate 64. The mounting surface 70 is substantially flat, matching the shape of the back surface 68, of the substrate 64 for minimizing any space separating the two surfaces 68 and 70. The mounting surface 70 can also have a small global curvature for improved substrate-to-chuck contact upon clamping.

An array of concentric conduits 74 conveys an uninhibited flow of gas to and from the heat-transfer interface 72 for enhancing transfers of heat between the inner portion 50 of the chuck body 38 and the substrate 64. Each of the concentric conduits 74 includes an inner conduit 76, which is connected to an inlet gas manifold 78, and an outer conduit 80, which is connected to an outlet gas manifold 82. A top end 84 of the inner conduit 76 is preferably slightly recessed with respect to a top end 86 of the outer conduit 80 to minimize flow resistance between the two top ends 84 and 86 at or near the heat-transfer interface 72. A single-tube conduit can be used instead of the array of concentric conduits 74 anywhere throughout the inner portion 50 of the chuck body 38 under the substrate 64 (e.g., at the center of the chuck body).

A plurality of circumferential (i.e., conforming to the shape of the substrate periphery) and radial channels or grooves 88 and 90 formed in the mounting surface 70 supports flows of gas throughout the heat-transfer interface 72. The circumferential and radial channels 88 and 90 intersect each other and the concentric conduits 74. However, an uninterrupted portion of the mounting surface 70 contacts a periphery of the substrate's back surface 68 forming a first-stage seal 92 for confining the substrate backside gas within the heat-transfer interface 72. The first-stage seal 92 together with the back surface 68 of the substrate and the adjacent mounting surface 70 of the chuck body forms a second pressure-regulatable space.

A mechanical clamp 96, which presses the substrate 64 against the mounting surface 70, functions as a secondary sealing structure for further isolating the gas flowing throughout the heat-transfer interface 72 (i.e., the second pressure-regulatable space) from the surrounding evacuatable space of the processing chamber 46 (i.e., the first pressure-regulatable space). An annular chamber 94 bounded by the mechanical clamp 96, the chuck body 38, and the substrate 64 forms a third pressure-regulatable space separating the first and second pressure-regulatable spaces.

A second-stage seal 98 joins the mechanical clamp 96 to the front surface 66 of the substrate 64, and another second-stage seal 100 joins the mechanical clamp 96 to the chuck body 38 of the chuck 36. The two second-stage seals 98 and 100 are relatively adjustable to accommodate different mounting positions of the clamp 96 associated with thickness variations among substrates or dimensional tolerances of the chuck. For example, a cantilevered portion 102 of the clamp 96 can be made sufficiently flexible to provide the required adjustment. The second-stage seals 98 and 100 themselves can also be arranged to provide such flexibility. For example, the second-stage seal 100 can be an oversized elastomer O-ring supported by the thermally isolated outer portion 52 of the chuck body 38.

An array of outlet conduits 104 connect the annular chamber 94 to an outlet manifold 106, which is entirely separate from the manifolds 78 and 82 that control flows of gas through the heat-transfer interface 72. Fluid couplings, such as the illustrated couplings 108 and 110 to the manifolds 78 and 82, connect each of the manifolds 78, 82, and 106 to separate groups of controls 114, 112, and 116 for regulating flows of fluid into or out of the manifolds 78, 82, and 106. Though depicted only schematically, the controls 112 and 116 function as conventional outlet controls for regulating gas flows out of the manifolds 82 and 106, and the controls 114 function as conventional inlet controls for regulating gas flows into the manifold 78. The outlet controls 112 and 116 include, for example, a common vacuum pump 118, but separate throttle valves 120 and 122 (or other adjustable-conductance valves) and pressure gauges 124 and 126. The inlet controls 114 include a gas supply 128, a mass flow controller 130, and a pressure gauge 132. A processor or electronic controller (not shown) monitors pressures sensed by the gauges 124, 132, and 126 and controls the valves 130, 120, and 122 for maintaining desired pressures in the respective manifolds 78, 82, and 106.

A continuous flow of an inert gas or other suitable gas (such as argon, helium, xenon, nitrogen, or hydrogen) is preferably maintained through the heat-transfer interface 72 so that variations in the flow rates into and out of the manifolds 78 and 82 can be used to make rapid changes or adjustments in pressure throughout the heat-transfer interface 72. The mounting surface 70 is preferably contiguous with the back surface 68 of the substrate throughout most of the heat-transfer interface 72 to further promote substrate-chuck heat transfers, but such contiguity can limit the effectiveness of the first-stage seal 92 for confining the gas within the heat-transfer interface 72. This invention recaptures gas leaking through the first-stage seal 92 within the annular chamber 94 (i.e., the third pressure-regulatable space), which can be exhausted at a lower pressure than the pressure maintained within the heat-transfer interface 72 (i.e., the second pressure-regulatable space). In fact, it is possible to reduce the pressure in the annular chamber 94 (third pressure-regulatable space) to less than or equal to the pressure in the processing chamber 46 (first pressure-regulatable space) for more completely isolating the heat-transfer interface 72 from the processing chamber 46.

For simplicity, a temperature regulator is not shown in the drawing FIGS. 2–4. However, a heating element, a cooling element, or both heating and cooling elements could be incorporated into the chuck body 38 for regulating the temperature of the substrate 64. The mechanical clamp 96, which functions as a secondary sealing structure, can be either thermally coupled or thermally isolated from the chuck body 38. For substrate cooling operations, the clamp 96 can be made of a high thermally conductive material or a low thermally conductive material. Generally, sealing is more difficult and substrate temperature nonuniformities are more pronounced at higher temperatures—so the clamp 96 is preferably thermally isolated from the chuck body 38 for heating operations. In order to minimize the heat-sinking effect of the mechanical clamp 96, a contacting portion of the clamp can be made from a thermal insulating material, such as a ceramic or resin material or other low-thermal-conductivity materials.

Thermal coupling of the clamp 96 to the chuck body 38 can be enhanced in several ways including making the clamp of a high thermal-conductive material or increasing the amount of common area in proximate contact between the chuck body 38 and the clamp 96. Thermal isolation of the clamp 96 can be accomplished conversely. For example, the clamp 96 can be made of a low-thermal-conductive material such as a ceramic or resin material, or a low thermal conductive material can be used to separate the clamp 96 from contact with the chuck body 38. Similarly, the spacing between the chuck body 38 and the clamp 96 can be increased along with the spacing between the second-stage seals 98 and 100 to improve long-term integrity of the seal 100 during heating operations. Some thermal isolation is also attributable to the low pressure environment in which the clamp 96 is mounted on the chuck body 38.

Figure 4A:
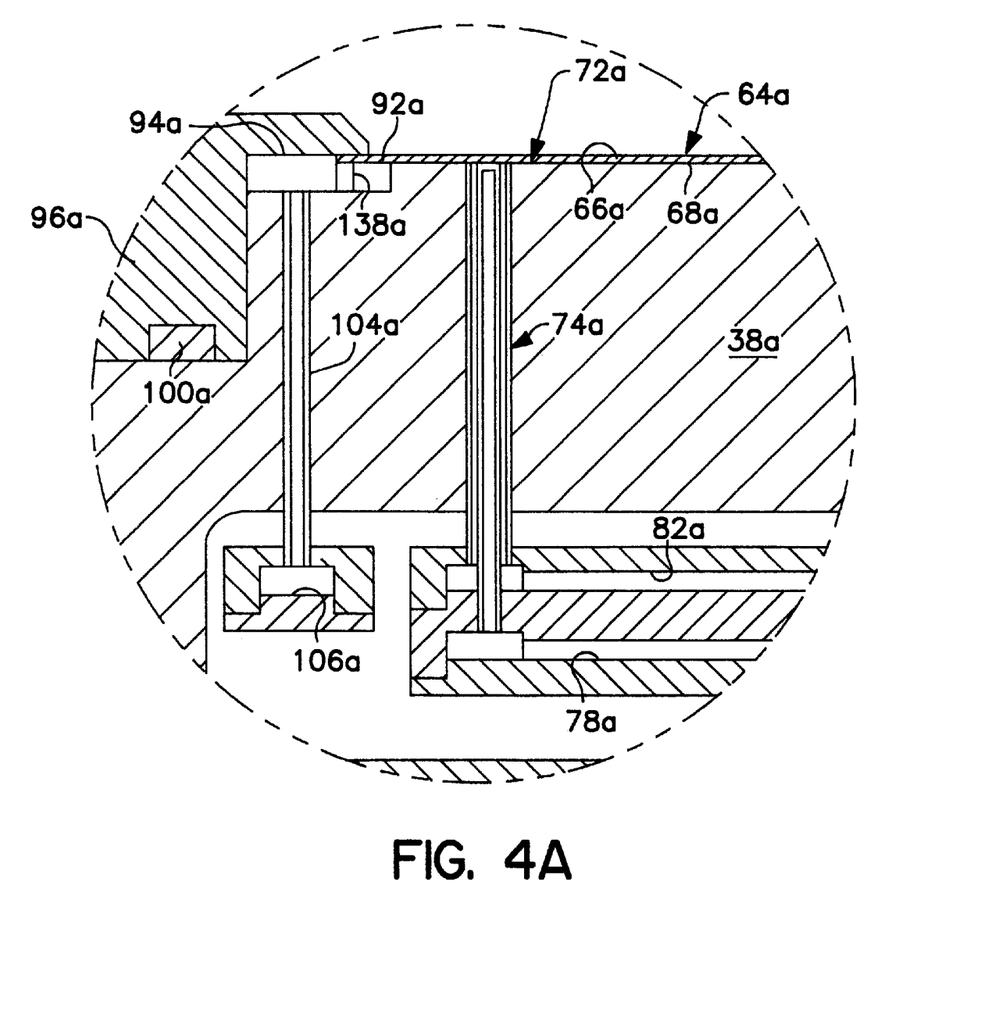
FIG. 4A is a similar partial view showing an alternative engagement region for forming two sealing stages.
Figure 4B:
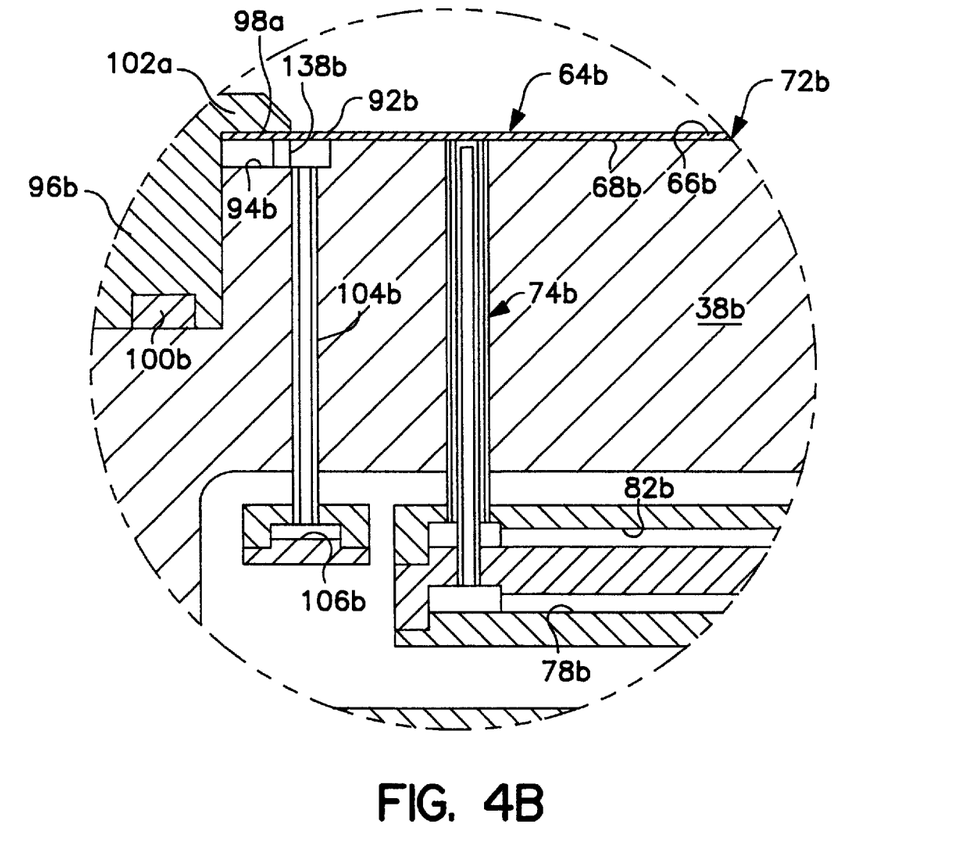
FIG. 4B is a similar partial view showing another alternative engagement region for forming two sealing stages.

The annular chamber 94 can also be constructed in a variety of different ways as illustrated in FIGS. 4A and 4B. Corresponding structures are referenced by the same numerals but are distinguished by the letters "a" and "b" for the different embodiments. For example, alternative annular chamber 94*a* is formed as a recess in chuck body 38*a*. Posts 138*a* support the overhung portions of the substrate 64*a* against a clamping force imparted by clamp 96*a* to top surface 66*a* of the substrate 64*a*.

Alternative annular chamber 94*b* is formed entirely beneath substrate 64*b*. Posts 138*b* similarly support the overhung portion of the substrate 64*b*. Conduits 104*b* are connected to the annular chamber 94*b* between the posts 138*b* and the periphery 92*b* of the heat-transfer interface 72*b*. The posts 138*b* permit free flows of gas between them to expose the entire back surface 68*b* to whatever gas may remain within the chamber 94*b*.

Figure 5:
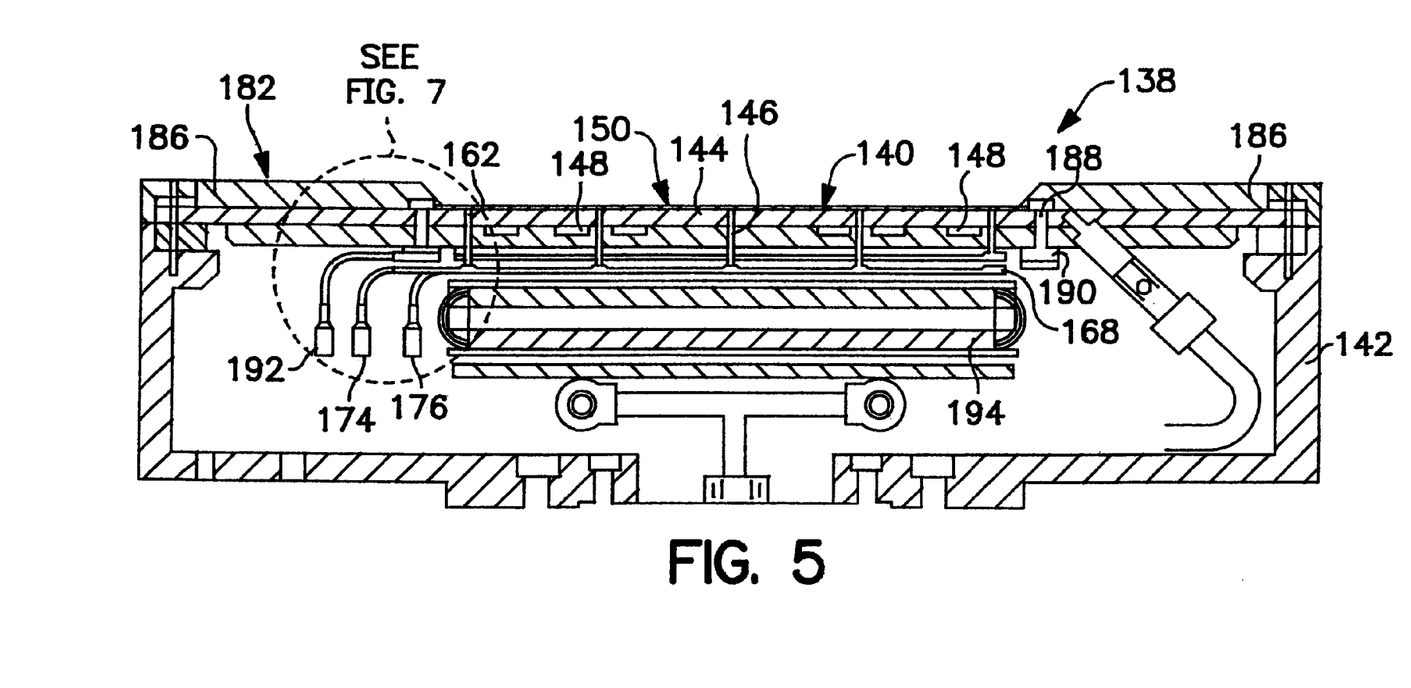
FIG. 5 is a cross-sectional view of an alternative chuck specifically arranged for cooling substrates.
Figure 6:
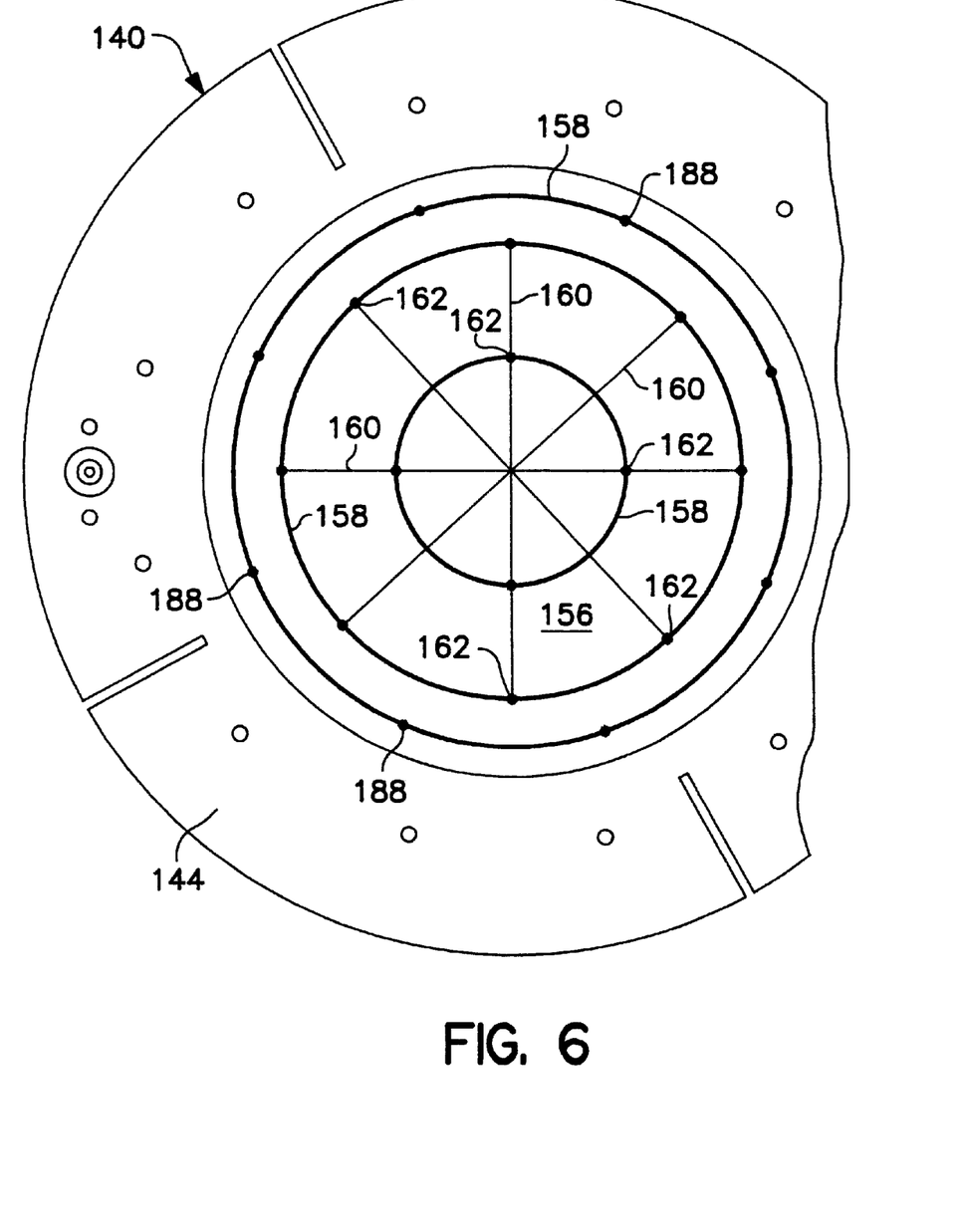
FIG. 6 is a top view of the body of the chuck shown in FIG. 5 with the mechanical clamp and substrate removed to show underlying features including gas circulating channels.
Figure 7:
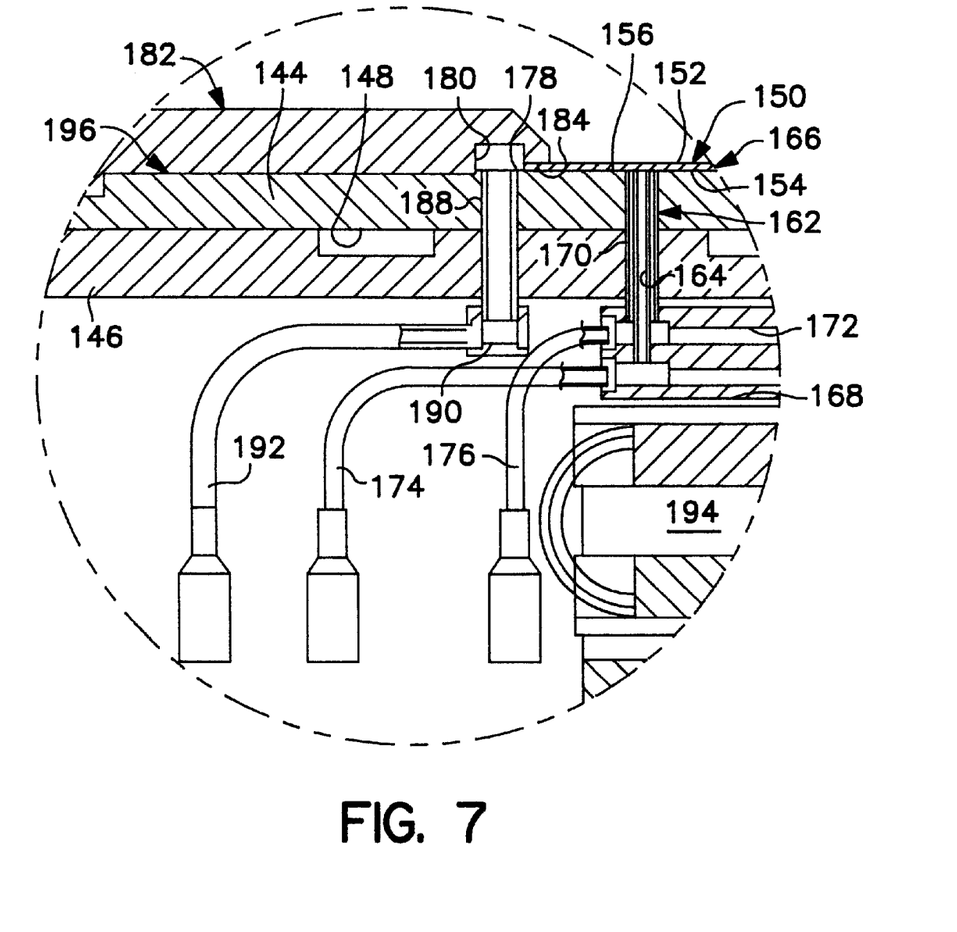
FIG. 7 is an enlarged partial view of FIG. 5 showing a region of engagement between the clamp, the substrate, and the chuck body for forming two sealing stages.

An alternative chuck 138 depicted by FIGS. 5–7 is adapted more specifically for cooling substrates. The chuck 138 has a chuck body 140 and a surrounding shroud 142. (A support column connecting the chuck 138 to a processing chamber is not shown.) The heat-conducting body 140 is formed by top and bottom plates 144 and 146, which are preferably connected together by a brazing process. Channels 148 formed between mating surfaces of the plates 144 and 146 circulate coolant through the heat-conducting body 140. A conventional coolant circulating or flow system such as a recirculating chiller (not shown) can be used to control the flow of coolant through the channels 148.

A substrate 150 has a front surface 152 exposed to evacuated space within a processing chamber (i.e., the first pressure-regulatable space) and a back surface 154 positioned in contact with a mounting surface 156 of the heat-conducting body 140. Except at circumferential and radial channels 158 and 160 formed in the mounting surface 156, the back surface 154 of the substrate 150 is substantially contiguous with the mounting surface 156, forming between them a heat-transfer interface 166 for transferring heat between the heat-conducting body 140 and the substrate 150. The heat-transfer interface could also be formed as a small-gap (e.g., 0.05 mm to 0.25 mm) gas pocket located between the mounting surface 156 and the substrate 150 and surrounded by a peripheral rim of the mounting surface for forming a first stage seal.

Similar to the preceding embodiments, concentric conduits 162 deliver flows of gas to and from the heat-transfer interface 166. Inner conduits 164 connect the heat-transfer interface 166 to an inlet manifold 168, and outer conduits 170 connect the heat-transfer interface 166 to an outlet manifold 172. Lines 174 and 176 connect the manifolds 168 and 172 to conventional gas flow and pressure controls, which are not shown. Single-tube conduits could be used to replace the concentric conduits 162 for separating inlet and outlet passageways to the heat-transfer interface 166 or for regulating pressure at the heat-transfer interface through a single passageway.

The circumferential and radial channels 158 and 160 in the mounting surface 156 assure the rapid flow and pressurization of gas throughout the heat-transfer interface 166. Again, however, an uninterrupted portion of the mounting surface 156 contacts a periphery of the substrate's back surface 154 forming a first-stage seal 178 for confining gas within the heat-transfer interface 166. The first-stage seal 178 together with the back surface 154 of the substrate and the adjacent mounting surface 156 of the heat-conducting body forms a second pressure-regulatable space.

Surrounding the first-stage seal 178 is an annular chamber (small-volume cavity) 180 formed largely by a recess in a mechanical clamp 182, which is otherwise intended to press the substrate 150 into contact with the heat-conducting body 140. The mechanical clamp 182 forms a first second-stage seal 184 with the front surface 152 of the substrate 150 and a second second-stage seal 186 with the heat-conducting body 140. The two second-stage seals 184 and 186 isolate the annular chamber 180 as a third pressure-regulatable space from the remaining evacuatable space within the processing chamber (the first pressure-regulatable space). Some flexibility is provided between the second-stage seals 184 and 186 to accommodate chuck tolerances and differences between substrates. For example, the seals can be formed by oversize elastomer O-rings or other seals with similar flexibility. Gas or other fluid leaking through the first-stage seal 178 is evacuated from the annular chamber 180 through single conduits 188 that connect the annular chamber 180 to a manifold 190. A line 192 connects the manifold 190 to a vacuum source (not shown).

The mechanical clamp 182 is thermally coupled to the heat-conducting body 140 to prevent excess heating of the clamp 182 during processing operations that transfer heat to the mechanical clamp 182. Most of the thermal transfer between the mechanical clamp 182 and the heat-conducting body 140 takes place through a contiguous interface 196 that extends within the annular chamber 180 between the second-stage seals 184 and 186. The mechanical clamp 182 is also preferably made of a heat-conducting material to also equalize temperatures throughout the rest of the clamp 182.

The chuck 138 can also be adapted for use with various electrical or magnetic energy sources for further affecting substrate processing. For example, a plate-shaped electromagnet 194 can be positioned next to the inlet manifold 168 to produce a uniaxial magnetic field in the vicinity of the substrate 150 for orienting domains of magnetic material on the substrate's front surface 152, such as during thin-film head fabrication processes.

Figure 8:
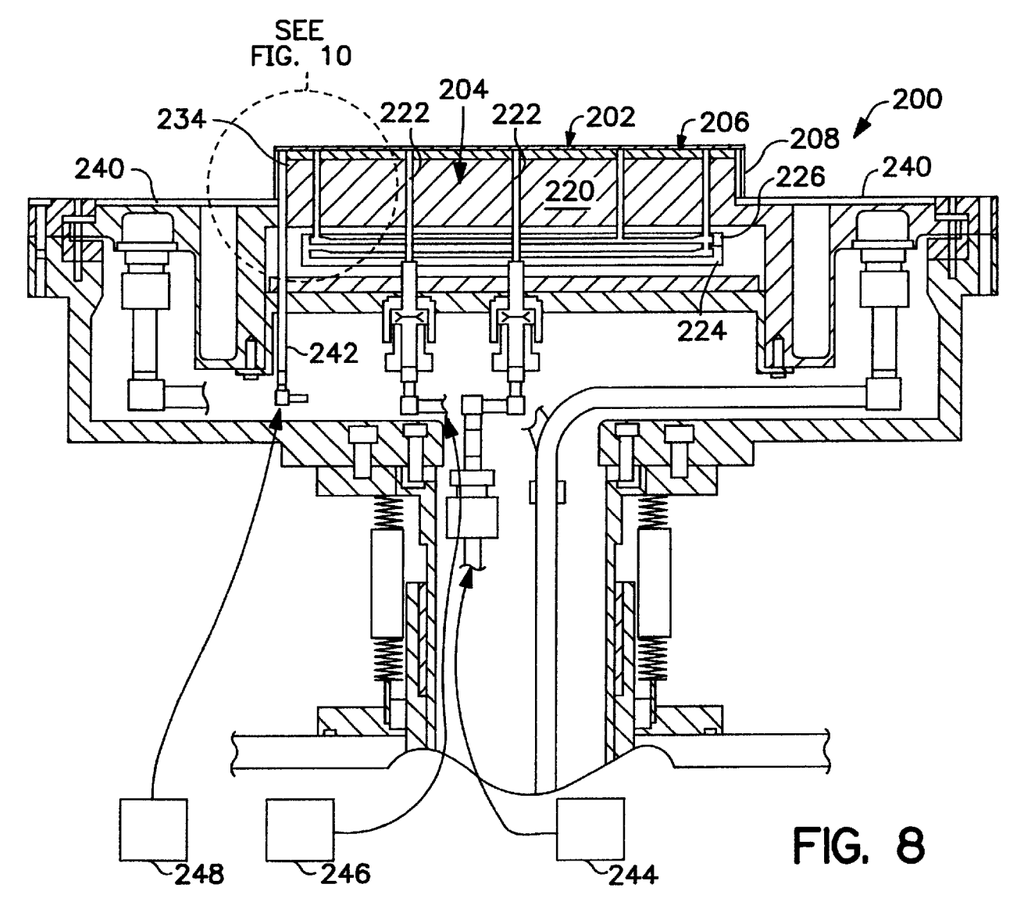
FIG. 8 is a cross-sectional view of another alternative chuck having an electrostatic clamp for securing substrates.
Figure 9:
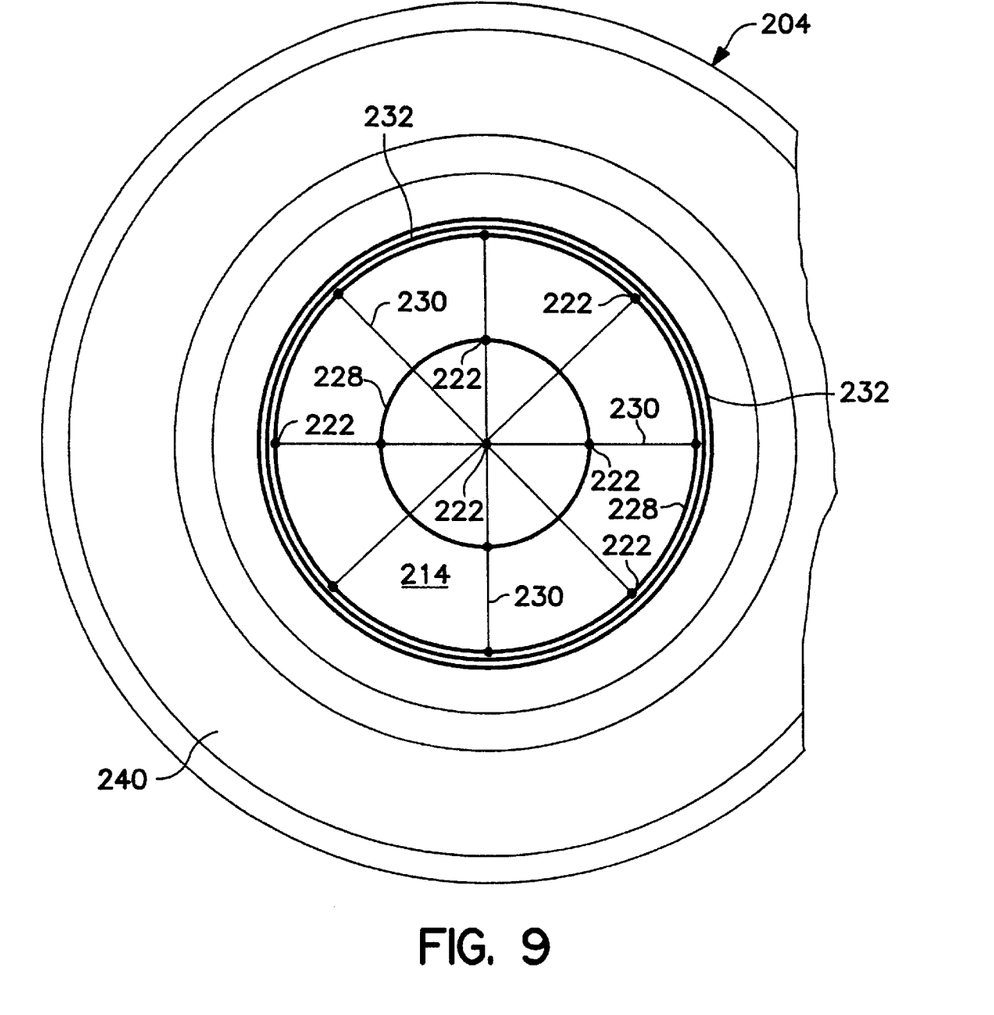
FIG. 9 is a top view of the body of the chuck shown in FIG. 8 showing gas circulating channels formed in a mounting surface of the chuck body.
Figure 10:
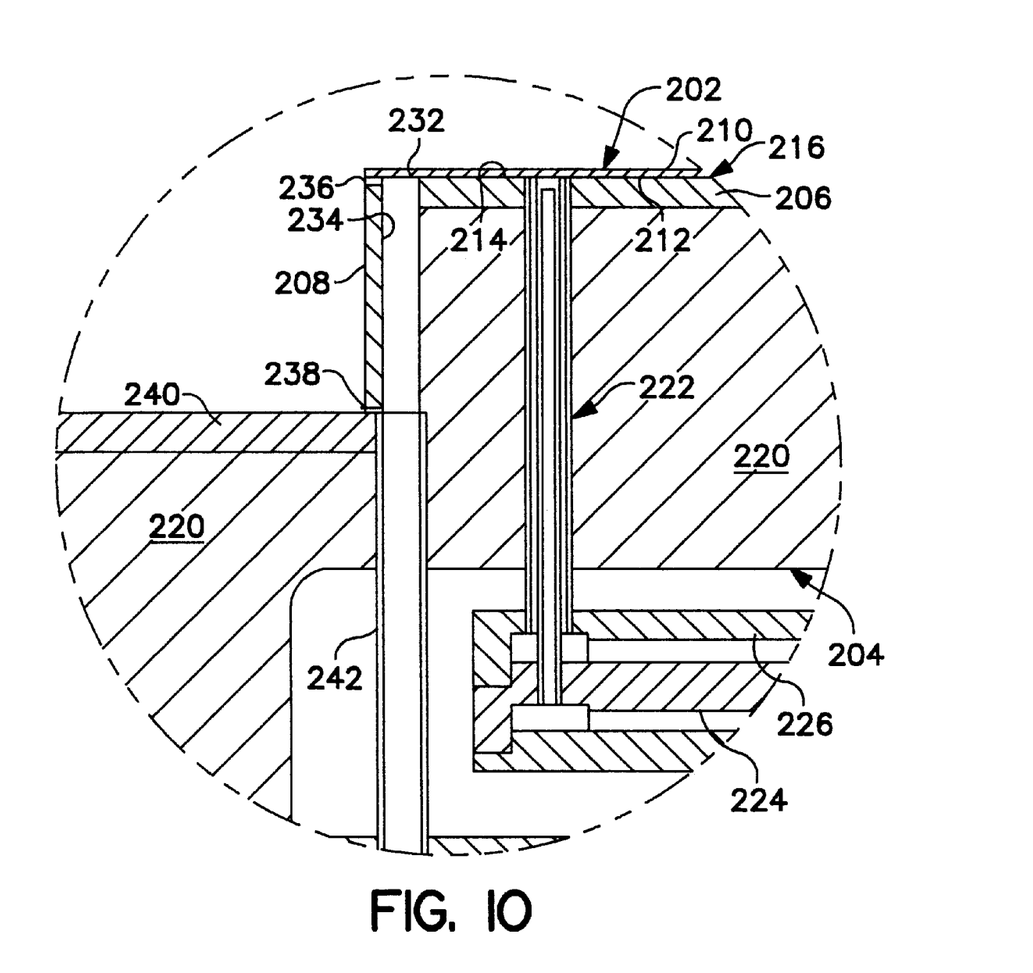
FIG. 10 is an enlarged partial view of FIG. 8 showing a region of engagement between the substrate, the chuck body, and a peripheral support for forming two sealing stages.

The last set of drawing figures, FIGS. 8–10, depict an alternative chuck 200, which uses a different means for mounting (and securing) a substrate 202 on a chuck body 204 and for sealing a space between the substrate 202 and the chuck body 204. An electrostatic clamp 206, which presses the substrate towards the chuck body 204 forms a first sealing stage between the substrate 202 to the chuck body 204 and a separate thermally isolated peripheral support 208 forms a second sealing stage between the substrate 202 and the chuck body 204.

The substrate 202 includes front and back surfaces 210 and 212. The front surface is exposed for processing within a first pressure-regulatable space of the processing chamber (not shown). A mounting surface 214 of the electrostatic clamp 206 is substantially contiguous with a central portion of the substrate's back surface 212. The overlapping areas of the substrate's back surface 212 and the mounting surface 214 form a heat-transfer interface 216 for transferring heat between the substrate 202 and a heat-conducting portion 220 of the chuck body 204. The peripheral support 208, which is preferably separated from the heat-conducting body portion 220, engages an overhung area of the substrate's back surface 212. The peripheral support 208 provides a full-peripheral engagement with the back surface 214 of the substrate 202 and also preferably provides some flexibility for imparting a controlled sealing force against the substrate 202. Particularly for heating operations, the peripheral support 208 can be made of a low-thermal conductivity material such as ceramic or resin or of a thin-walled metal structure with sufficient thermal isolation from the heat conducting portion 220 of the chuck body 204 to minimize thermal loading effects of the substrate 202.

Similar to the other embodiments, concentric conduits 222 convey gas between the heat-transfer interface 216 and inlet and outlet manifolds 224 and 226. Circumferential and radial grooves 228 and 230 formed in the mounting surface 214 provide for circulating the gas throughout the heat-transfer interface 216. A surrounding portion of the mounting surface 214 forms together with the back surface 212 of the substrate a first-stage seal 232 for confining gas within the heat-transfer interface 216, now a second pressure-regulatable space.

An annular chamber (or surrounding cavity) 234 bounded by the substrate 202, the chuck body 204, and the peripheral support 208 forms a third pressure-regulatable space that entirely surrounds the second pressure-regulatable space. A second-stage seal 236 at a top rim of the peripheral support 208 joins the peripheral support 208 to the substrate's back surface 212. A second-stage seal 238 at a bottom rim of the peripheral support 208 joins the peripheral support 208 to a non-conducting (or thermal insulating) portion 240 of the chuck body 204.

In comparison to the secondary sealing structure of the immediately preceding embodiment, the peripheral support 208 is more thermally isolated from the heat-conducting portion 220 of the chuck body 204 and does not contribute to substrate temperature regulation. Features that contribute to the thermal isolation include the physical spacing of the peripheral support 208 from the heat-conducting portion 220 of the chuck body 204 and the non-conducting portion 240 of the chuck body 204 that separates the second-stage seal 238 from the heat-conducting body portion 220. Either or both the non-conducting portion 220 or the peripheral support 208 could also be made of a low-thermal-conductivity material, such as ceramic or resin, or of a thin-walled metallic structure, such as stainless steel, for further isolating the second-stage seal 236.

The annular chamber 234 itself functions as a gas manifold so that only a single conduit 242 is needed to regulate flows from the annular chamber 234. The inlet and outlet manifolds 224 and 226 (whose functions can be reversed), as well as the single conduit 242 from the annular chamber 234, are connected to separate flow controls 244, 246, and 248. Under direction of the flow (or pressure) control 248 (e.g., via a vacuum pump-out), pressure within the annular chamber 234 (the third pressure-regulatable space) can be reduced with respect to pressure within the heat-transfer interface (the second pressure-regulatable space) for inhibiting leakage of gas from the heat-transfer interface into the processing chamber (the first pressure-regulatable space).

The electrostatic clamp 206, which is made from layers of electrically conductive and non-conductive (insulating) materials, is preferably joined to the chuck body 204 by bonding (e.g., epoxy) or brazing. Both are preferably thermally conductive to minimize any resistance to heat transfers between the heat-conducting body 220 and the substrate 202. An attractive force exerted by the electrostatic clamp 206 presses the substrate 202 toward the chuck body 204. However, just prior to contacting the chuck body 204, the substrate 202 contacts the peripheral support 208 (preferably with a soft spring-load force) for engaging the second-stage seal 236. Preferably, one of the second-stage seals 236 or 238 is sufficiently flexible (e.g., bellows or an elastomer seal) to permit the substrate to also contact the first-stage seal 232 on the mounting surface 214 of the chuck body 204.

Just a few of the types of thermally-conductive chucks that can benefit from this invention have been described, but those of skill in the art will appreciate the many variations that are possible for implementing this invention. For example, with some relatively straightforward structural modifications, thermally conductive chucks disclosed in my copending U.S. Patent Application entitled "Thermally Conductive Chuck for Vacuum Processor" filed Sep. 19, 1997 and based on U.S. Provisional Application Ser. No. 60/035,734 filed Jan. 2, 1997, which application is hereby incorporated by reference can be adapted to the practice of this invention. Instead of promoting a free flow of gas through a periphery of a thermal-transfer interface between a chuck body and substrate, a first stage seal is formed around the periphery. Second-stage seals are defined by existing seals that link the chuck body and substrate through an intermediate sealing structure.

I claim:

1. A thermally conductive chuck for supporting a substrate within a vacuum processing chamber comprising:

a chuck body having a mounting surface that supports the substrate for processing within a first pressure-regulatable space of the processing chamber;

said mounting surface being positioned for forming together with the substrate a second pressure-regulatable space for assisting transfers of heat between said chuck body and the substrate;

a clamp that presses the substrate against the mounting surface and that forms together with said chuck body and the substrate a third pressure-regulatable space that extends beyond a periphery of the substrate between the first and second pressure-regulatable spaces;

the third pressure-regulatable space separating the second pressure-regulatable space from the first pressure-regulatable space;

a first conduit that delivers fluid to the second pressure-regulatable space and a second conduit that evacuates fluid from the third pressure-regulatable space for reducing pressure in the third pressure-regulatable space with respect to the second pressure-regulatable space;

said first conduit being one of a pair of concentric conduits for conveying fluid both to and from the second pressure-regulatable space; and said concentric conduits including inner and outer conduits each having first and second ends and further comprising an inlet manifold connected to said first end of one of said inner and outer conduits and an outlet manifold connected to said first end of the other of said inner and outer conduits.

2. The chuck of claim 1 in which said second ends of the inner and outer conduits are in communication with both said second pressure-regulatable space and each other for supporting a substantially uninhibited flow of fluid between said second ends of the inner and outer conduits.

3. A thermally conductive chuck for supporting a substrate within a vacuum processing chamber comprising:

a chuck body having a mounting surface that supports the substrate for processing within a first pressure-regulatable space of the processing chamber;

said mounting surface being positioned for forming together with the substrate a second pressure-regulatable space for assisting transfers of heat between said chuck body and the substrate;

a clamp that presses the substrate against the mounting surface and that forms together with said chuck body and the substrate a third pressure-regulatable space that extends beyond a periphery of the substrate between the first and second pressure-regulatable spaces;

said mounting surface contacting the back surface of the substrate for inhibiting flows of fluid between the second and third pressure-regulatable spaces;

said clamp contacting both the substrate and the chuck body for inhibiting flows of fluid between the first and third pressure-regulatable spaces;

said clamp contacting the front surface of the substrate and the chuck body for inhibiting flows of fluid between the first and third pressure-regulatable spaces; and a portion of the third pressure-regulatable space being formed by a recess in said chuck body.

4. A thermally conductive chuck for supporting a substrate in a vacuum processing environment comprising:

a chuck body in thermal communication with a temperature regulator and having a mounting surface that supports the substrate for processing within a first pressure-regulatable space of the processing chamber;

said mounting surface being arranged for forming together with the substrate a second pressure-regulatable space;

a sealing structure that is at least partially thermally isolated from said temperature regulator and that forms together with said chuck body and the substrate a third pressure-regulatable space;

said mounting surface being shaped for contacting a first portion of the substrate for inhibiting flows of fluid between the second and third pressure-regulatable spaces;

said sealing structure being shaped for contacting a second portion of the substrate for inhibiting flows of fluid between the first and third pressure-regulatable spaces;

a first conduit that delivers fluid to the second pressure-regulatable space and a second conduit that evacuates fluid from the third pressure-regulatable space for reducing pressure in the third pressure-regulatable space with respect to the second pressure-regulatable space;

a third conduit for evacuating fluid from the second pressure-regulatable space for circulating fluid through the second pressure-regulatable space;

said first conduit and third conduits being arranged as a pair of concentric conduits for conveying fluid both to and from the second pressure-regulatable space; and said concentric conduits include inner and outer conduits each having first and second ends and further comprising an inlet manifold connected to said first end of one of said inner and outer conduits and an outlet manifold connected to said first end of the other of said inner and outer conduits.

5. The chuck of claim 4 in which said second ends of the inner and outer conduits are in communication with both said second pressure-regulatable space and each other for supporting a substantially uninhibited flow of fluid between said second ends of the inner and outer conduits.

6. A thermally conductive chuck for supporting a substrate in a vacuum processing environment comprising:

a chuck body having a mounting surface that supports the substrate for processing within a first pressure-regulatable space of the processing chamber;

said mounting surface being arranged for forming together with the substrate a second pressure-regulatable space;

a sealing structure that forms together with said chuck body and the substrate a third pressure-regulatable space;

a fluid flow control system having independent flow paths from the second and third pressure-regulatable spaces for exhausting fluid from the third pressure-regulatable space at a lower pressure than fluid exhausted from the second pressure-regulatable space;

said fluid control system including an inlet conduit and a first outlet conduit for flowing fluid through the second pressure-regulatable space and a second outlet conduit for removing fluid from the third pressure-regulatable space;

said inlet conduit and said first outlet conduit being arranged as a pair of concentric conduits for conveying fluid both to and from the second pressure-regulatable space;

a first end of one of said inner and outer conduits being connected to a supply of fluid and a first end of the other of said inner and outer conduits being connected to a vacuum pump-out; and second ends of said inner and outer conduits forming concentric openings in said mounting surface for conveying fluid both to and from the second pressure-regulatable space.

7. The chuck of claim 6 in which said second end of the inner conduit is recessed with respect to said second end of the outer conduit for conveying fluid between said inner and outer conduits.

* * * * *